(12) United States Patent
Eckert et al.

(10) Patent No.: US 8,535,956 B2
(45) Date of Patent: Sep. 17, 2013

(54) CHIP ATTACH FRAME

(75) Inventors: Martin Eckert, Moetzingen (DE); Otto Torreiter, Leinfelden-Echterdingen (DE); Quintino L. Trianni, Böblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/396,207

(22) Filed: Feb. 14, 2012

(65) Prior Publication Data

US 2013/0207250 A1    Aug. 15, 2013

(51) Int. Cl.
*G01R 31/26* (2006.01)

(52) U.S. Cl.
USPC .............. 438/14; 438/17; 438/106; 257/676

(58) Field of Classification Search
USPC .............. 438/106, 123, 121; 257/676, 666
See application file for complete search history.

(56) References Cited

U.S. PATENT DOCUMENTS

| | | | |
|---|---|---|---|
| 5,489,854 | A | 2/1996 | Buck |
| 6,127,254 | A | 10/2000 | Diebold et al. |
| 6,242,274 | B1 | 6/2001 | Nyholm |
| 6,290,401 | B1 | 9/2001 | Tian |
| 7,326,066 | B2 | 2/2008 | Momenpour et al. |
| 2002/0043984 | A1 | 4/2002 | Torreiter |

FOREIGN PATENT DOCUMENTS

| | | |
|---|---|---|
| JP | 6037124 | 2/1994 |
| WO | 8701509 | 3/1987 |
| WO | 0204968 | 1/2002 |

OTHER PUBLICATIONS

"Method for the use of corner posts for the alignment of very fine pitch chip scale packages during placement on printed circuit boards", IP.com Prior Art Database, Disclosure No. IPCOM000008379D dated Jun. 11, 2002 (anonymous).
Tewksbury, S., et al., "Chip Alignment Templates for Multichip Module Assembly" abstract [online], retrieved on Feb. 13, 2012, from the Internet URL: ieeexplore.ieee.org/Xplore/login.jsp?url=http%3A%2F%2Fieeexplore.ieee.org%2Fiel6%2F33%2F25203%2F01134701.pdf%3Farnumber%3D1134701&authDecision=-203.

*Primary Examiner* — Julio J Maldonado
*Assistant Examiner* — Robert Bachner
(74) *Attorney, Agent, or Firm* — Matthew B. Talpis; Jack V. Musgrove

(57) ABSTRACT

A chip attach frame is used to align pins of an integrated circuit chip with pads on a chip carrier. A frame block has a socket defining two alignment edges that form a reference corner. The chip is lowered into the socket, and the chip carrier is inclined while it supports the frame block and chip until the chip moves under force of gravity to the reference corner. Once located at the reference corner, the chip position is carefully adjusted by moving the frame block in the x- and y-directions until the pins are aligned with the pads. The frame block is spring biased against movement in the x- and y-directions, and the position of the frame block is adjusted using thumbscrews. A plunger mechanism can be used to secure the integrated circuit chip in forcible engagement with the chip carrier once the pins are aligned with the pads.

6 Claims, 3 Drawing Sheets

CHIP ATTACH FRAME

BACKGROUND OF THE INVENTION

1. Field of the Invention

The present invention generally relates to the interconnection of electronic devices such as integrated circuit chips, and more particularly to a method of providing a temporary attachment between an integrated circuit chip and a carrier or package for testing.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells formed on a semiconductor substrate (e.g., silicon), with electrical interconnections between the cells. An IC may include a very large number of cells and may require a large number of external metallic contacts to serve as input or output pins.

As integrated circuit designs become more complex and the size of integrated circuit chips continues to shrink, pin densities grow and it becomes increasingly more difficult to interconnect the chip to external circuitry. Chips are commonly attached to a main system substrate such as a printed circuit board (PCB) using a carrier or package which fans out the connections from the external pins of a chip to wires on the PCB. FIG. 1 illustrates a typical chip assembly 10 which includes an IC chip 12, a chip carrier 14, a PCB 16, and miscellaneous components such as capacitors 18. These various elements may be electrically coupled using surface-mount connections with controlled collapse chip connection (C4) solder ball arrays. IC chip 12 is connected to package 14 which is in turn connected to PCB 16. Package 14 and PCB 16 both have multiple horizontal layers interconnected by vertical vias. A single layer may contain multiple planes, i.e., some for wiring and others for an electrical ground plane or a power plane. A given plane in package 14 may have multiple connections to the top and bottom surfaces to couple ground or power planes of IC chip 12 to ground or power planes of PCB 16. For state-of-the-art designs, it may be necessary to connect hundreds of chip pins to respective carrier pads.

SUMMARY OF THE INVENTION

The present invention is directed to an improved method for temporarily connecting an integrated circuit chip to a chip carrier by placing a frame block above the upper surface of the chip carrier, the frame block having a socket opening defining two alignment edges forming a reference corner, the socket opening being larger than the integrated circuit chip and located such that the pads are accessible through the socket opening when the frame block is so placed above the upper surface of the chip carrier, and the frame block being movable in at least first and second non-parallel directions along the upper surface of the chip carrier, then lowering the integrated circuit chip into the socket opening until the lower surface of the integrated circuit chip rests on the upper surface of the chip carrier. The chip carrier is inclined while it supports the frame block and integrated circuit chip until the integrated circuit chip moves under force of gravity toward the reference corner to abut the alignment edges of the socket opening, whereupon the position of the frame block is adjusted by moving it in the first direction and moving it in the second direction, until the pins are aligned with the pads. In the exemplary embodiment wherein the chip is rectangular, the socket opening is also rectangular, i.e., the two alignment edges are orthogonal, and the first and second directions are parallel with the two alignment edges, respectively. The frame block can be biased against movement in the first direction and biased against movement in the second direction, and the position of the frame block can be adjusted using first screw means which pushes against a first side of the frame block in the first direction and using second screw means which pushes against a second side of the frame block in the second direction. A plunger mechanism can further be used to secure the integrated circuit chip in forcible engagement with the chip carrier after the pins are aligned with the pads. The chip carrier can be operatively attached to a test board as part of a testing system.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

It is often necessary to connect an IC chip to a carrier temporarily, such as for testing purposes. The testing may be desired for quality assurance at the factory, or for a chip that has already been deployed in the field but has suffered some defect. It is preferable to attach the chip to the test carrier without a permanent (solder) connection so that the chip may easily be removed from the test carrier and then placed into operation. It can be particularly advantageous to provide solderless connections in situations where for example one chip of a multi-chip module has been removed from the final product to diagnose a failure indication. In these situations when the chip under investigation is soldered to a test carrier, the diagnostic system often returns a "No Defect Found" result because of unpredictable self-healing effects that can arise during the hot solder process step.

One problem associated with temporary chip attachment for testing purposes is the alignment of the chip pins with the carrier pads. There is very little tolerance in this alignment as the distance between adjacent chip pins (pitch) may be as small as 0.5 millimeters. The problem is exacerbated by saw cut variations in fabrication of the chip which can lead to inconsistent chip lengths or widths. Such variations prevent alignment systems from using predefined measurements or placement of the chip. One solution to this problem is the solderless temporary chip attachment method described in U.S. Pat. No. 6,127,254. According to that method, two thin pieces of polyimide foil are used as a placement stop for the pads, and the chip is moved until the pads are in contact with the foil edges. However, the foils are generally not reusable, and so add expense to the process. More complicated alignment systems similarly add excessive cost to the chip-carrier attachment process.

In light of the foregoing, it would be desirable to devise an improved method of aligning a chip for temporary attachment to a carrier such as for testing purposes. It would be particularly advantageous if the method could easily accommodate variations in die cut size while retaining ease of use and low cost. The present invention achieves these objects by using gravity to pull a chip to a reference point or corner inside an alignment socket of a chip attach frame which overlies a test carrier. The position of the chip attach frame can then be easily adjusted along x- and y-directions to properly align the pins of the chip to the pads of the test carrier.

Figure 1:
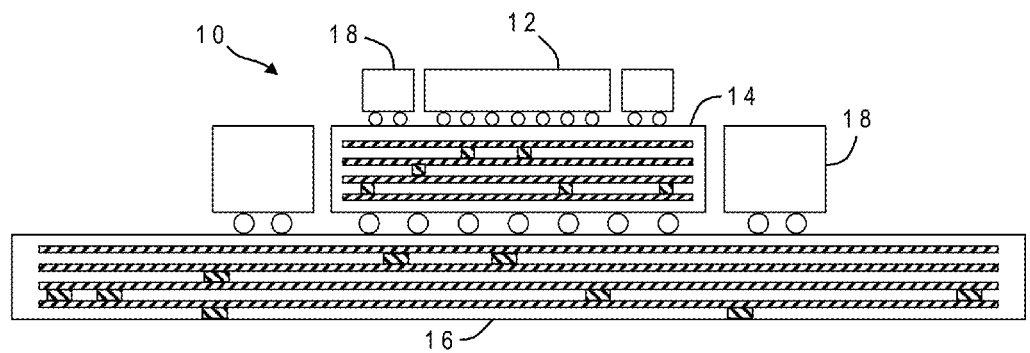
FIG. 1 is a cross-sectional side view of a conventional integrated circuit chip assembly including an integrated circuit chip which is connected to a printed circuit board by means of a chip carrier.
Figure 2:
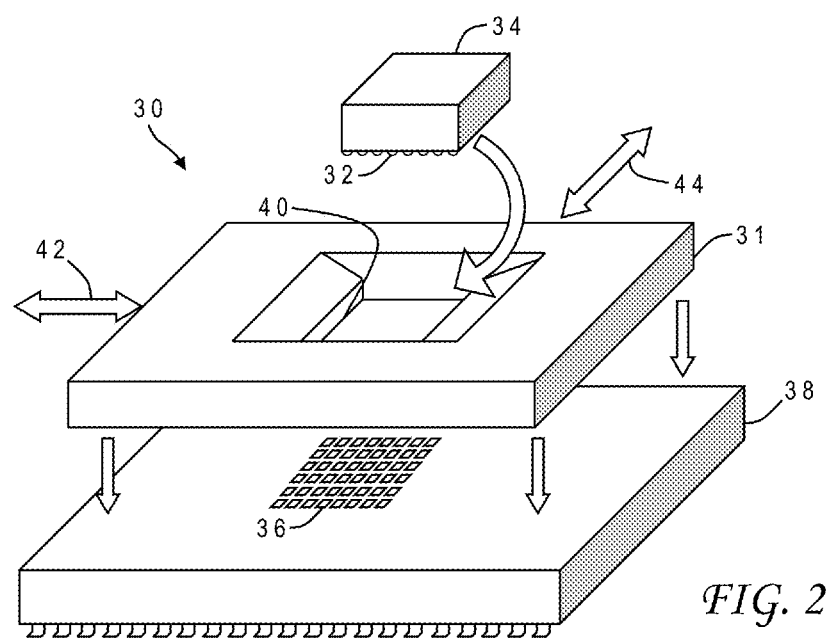
FIG. 2 is an exploded perspective view of one embodiment of a chip attach frame constructed in accordance with the present invention which is used to align pins of the integrated circuit chip with contact pads of a carrier.

With reference now to the figures, and in particular with reference to FIG. 2, there is depicted one embodiment 30 of a chip attach frame constructed in accordance with the present invention for aligning pins 32 of an integrated circuit chip 34 with pads 36 of a test carrier 38. Chip 34 may be freshly cut out of a wafer and ready for factory testing or may be desoldered/detached from a product carrier for diagnosing a failure. Chip attach frame includes a frame block 31 preferably having a thickness which is slightly smaller than the thickness of chip 34. In this implementation chip 34 has a rectangular shape and frame block 31 accordingly has a generally rectangular opening or alignment socket 40 which is slightly larger than chip 34, i.e., the width of alignment socket 40 is slightly greater than the width of chip 34, and the length of alignment socket 40 is slightly greater than the length of chip 34. This increased size of alignment socket 40 allows chip attach frame 30 to accommodate variations in chip size due to saw cut tolerances while still retaining chip 34 in a confined space relative to carrier 38. The socket is located within the frame block such that the carrier pads are accessible when the frame block is placed on the chip carrier.

Alignment socket 40 preferably has sloping shelves on at least two opposing sides (at the top surface of frame block 31) to facilitate lowering chip 34 in socket 40 and raising chip 34 out of socket 40. For cost reasons the illustrative implementation relies on manual placement of chip 34 in socket 40 but a mechanical picking device could alternatively be used. Chip attach frame 30 further includes first means 42 for adjusting the position of frame block 31 along a first direction relative to carrier 38 and second means 44 for adjusting the position of frame block 31 along a second direction relative to carrier 38. In the illustrative embodiment wherein the chip is rectangular and the inside edges of alignment socket 40 are orthogonal, the first direction is an x-direction in a Cartesian coordinate system and the second direction is a y-direction in that system, i.e., the two directions are likewise orthogonal. In this manner, when chip 34 is placed inside socket 40, the entire assembly (chip 34, frame block 31, and carrier 38) may be inclined whereby chip 34 slides under the influence of gravity towards the lowest inside corner (a reference corner) of socket 40. Once so positioned, the adjustment means 42, 44 can be employed to refine the location of chip 34 until its pins 32 are aligned over pads 36 of carrier 38.

Figure 3A:
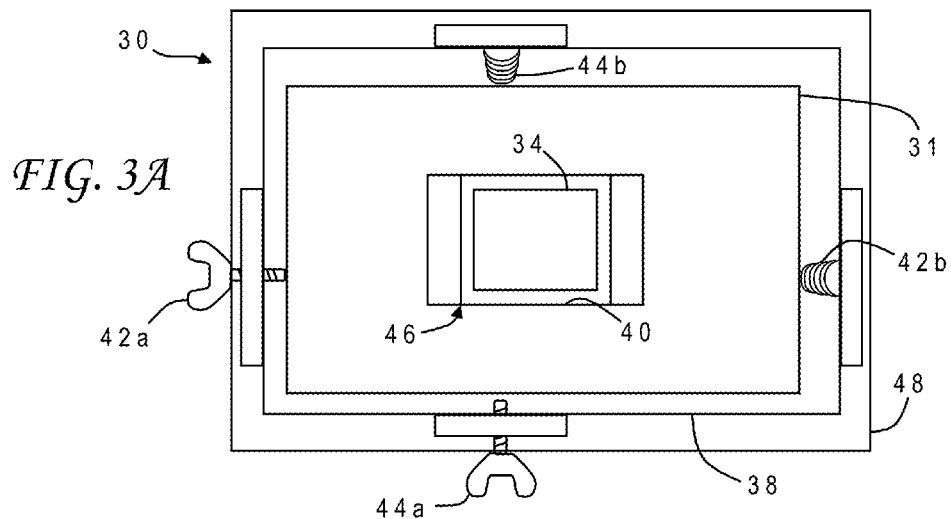
FIG. 3A is a top plan view of one embodiment of a chip attach frame constructed in accordance with the present invention showing the integrated circuit chip loosely placed (unaligned) within an alignment socket of the chip attach frame.
Figure 3B:
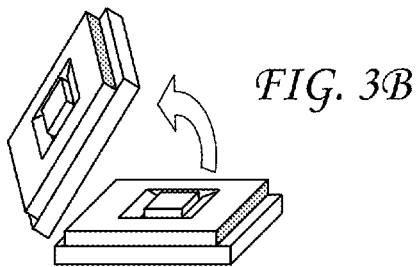
FIG. 3B is a pictorial illustration of the chip attach frame of FIG. 3A depicting inclination of the frame to allow the integrated circuit chip to be pulled by gravity toward a reference corner of the alignment socket.
Figure 3C:
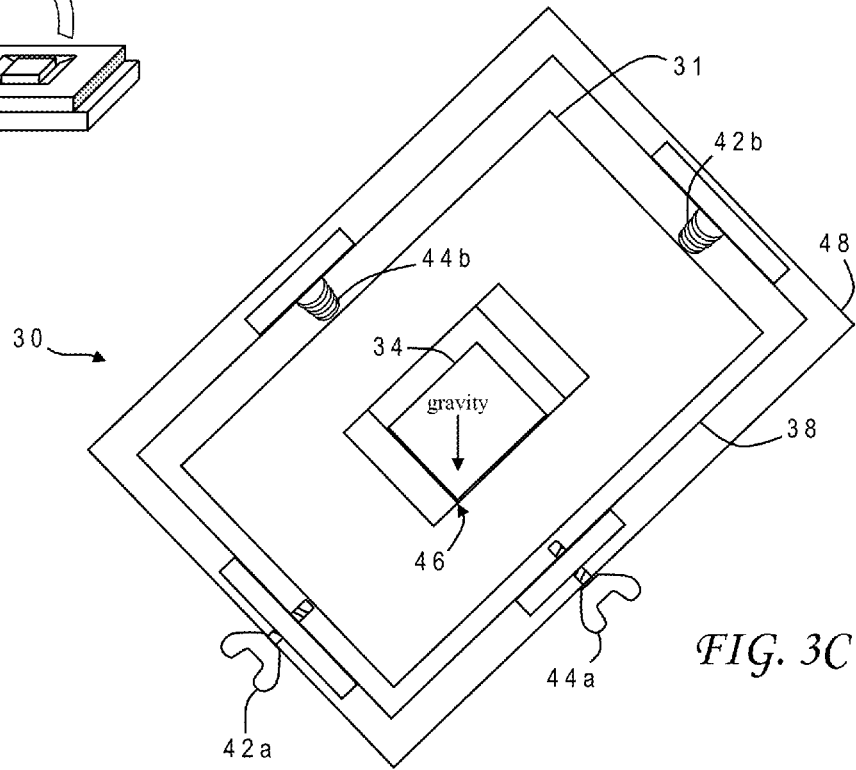
FIG. 3C is a top plan view of the chip attach frame of FIG. 3A showing how the integrated circuit chip has moved under influence of gravity into forcible contact with alignment edges of the alignment socket.

With further reference to FIGS. 3A-3C, the lower left corner of alignment socket 40 (as chip attach frame 30 is viewed from the front) has been designated as the reference corner 46. FIG. 3A shows an initial placement of chip 34 within socket 40, with slight gaps along each of the four sides of chip 34, i.e., in a generally unaligned state. Chip attach frame 30 and carrier 38 are further resting on a test board 48 which is electrically interconnected with carrier 38 and is part of the testing/diagnostic equipment used to evaluate chip 34. The assembly is tilted forward and to the left as depicted in FIG. 3B, whereupon gravity pulls chip 34 toward reference corner 46. The resulting view seen in FIG. 3C shows chip 34 forcibly abutting the inside alignment edges of socket 40 that together form reference corner 46. The assembly does not need to be raised from the horizontal orientation to a fully vertical orientation (plumb), only sufficiently tilted such that the force of gravity overcomes the frictional engagement of the lower chip surface with the upper carrier surface to allow the chip to slide within socket 40.

In this state (with chip 34 positioned against reference corner 46), chip 34 may still be unaligned, that is, the pins of the chip may not yet be appropriately positioned for contact with the pads of the carrier. If the chip is not aligned, the adjustment means are used to push chip 34 in the appropriate direction(s). In the illustrative embodiment the x-direction adjustment means includes a first thumbscrew 42a in forcible contact with the left side of frame block 31 and a first spring 42b in forcible contact with the right side of frame block 31. Spring 42b biases the position of block 31 to the left, and thumbscrew 42a is used to force frame block 31 to move to the right against that spring bias. The y-direction adjustment means similarly includes a second thumbscrew 44a in forcible contact with the front side of frame block 31 and a second spring 44b in forcible contact with the back side of frame block 31. Spring 44b biases the position of frame block 31 to the front, and thumbscrew 44a is used to force frame block 31 to move to the back against that spring bias. The thumbscrews and springs can be mounted on backstops affixed to test board 48. While the thumbscrews and springs provide a simple way to effectuate fine adjustment of the chip position, those skilled in the art will appreciate that other means may be used, such as electro-mechanical, piezo, stepping motor, etc. Verification of proper alignment can be achieved using an optical system or observing electrical contact results between the pins and the pads via the test system.

While socket 40 is illustrated as being rectangular, it could have other shapes, particularly if the chip is not rectangular. For example, if a chip were hexagonal in shape, the socket could be hexagonal to match the shape, or could be triangular. It is also not necessary to have a socket that is completely enclosed; only two edges are necessary to form the reference corner and to provide adjustment in two different directions. Moreover, in the illustrative embodiment the adjustment directions are parallel with the respective alignment edges of the sockets, but the adjustment directions can be oblique to the alignment edges. It should also be apparent from the foregoing that the alignment edges do not have to be orthogonal.

Figure 4:
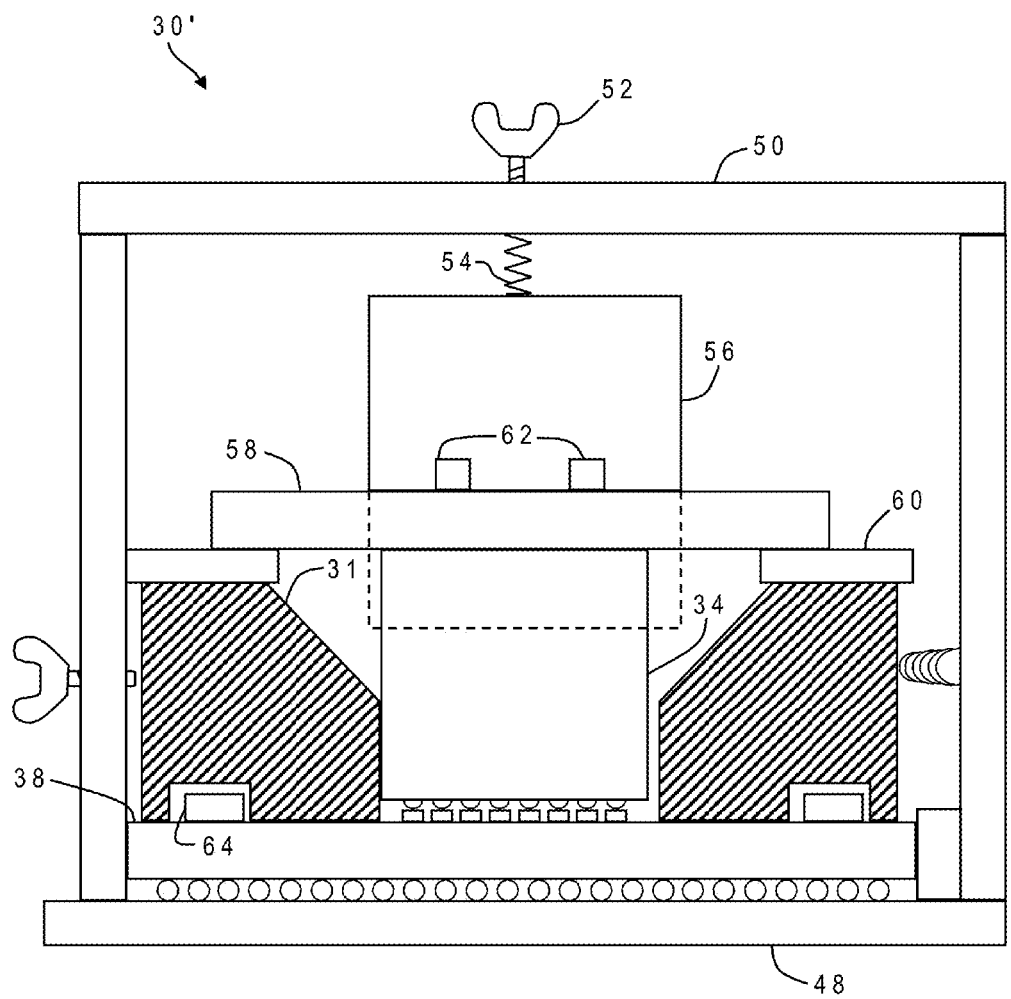
FIG. 4 is a cross-sectional side view of another embodiment of a chip attach frame constructed in accordance with the present invention illustrating a plunger mechanism to temporarily maintain the integrated circuit chip in contact with the carrier once the chip pins and carrier pads have been aligned.

The invention may be further enhanced by providing a mechanism to securely retain the chip in temporary contact with the carrier once the pins/pads have been aligned. FIG. 4 illustrates another embodiment 30' of a chip attach frame constructed in accordance with the present invention which additionally includes a plunger mechanism that maintains positive contact between the pins and pads. Chip attach frame 30' has a top plate or beam 50 attached to the same backstops that support one of the sets of thumbscrews and biasing springs. Another thumbscrew 52 passes through beam 50 and is used to actuate a plunger spring 54 which is attached to a plunger block 56. Plunger block 56 rests atop a pressure plate 58 which in turn rests atop chip 34. The bottommost side of plunger block 56 may extend beyond pressure plate 58 for cases of reduced chip height as indicated by the dashed lines. Rubber (elastomeric) strips 60 are interposed between pressure plate 58 and the upper surface of frame block 31 in case the plunger force is not uniform, for example due to a non-planar chip backside. Non-horizontal movement of the plunger downwards will cause uneven pressure on one side of the chip earlier than the other side. As a result, the generally downward force vector of the plunger can include a small sideways force vector. This sideways force vector can lead to displacement of the chip, i.e., causing new misalignment of the pads/pins. The rubber strips compensate for any uneven pressure and level the plunger block face as it impacts the chip backside, which helps avoid cracking of the chip.

Plunger block 56 can be lowered against chip 34 while chip attach frame 30' is in the inclined position with chip 34 lying against reference corner 46 under the force of gravity, and aligned by the adjustment means. Once the plunger mechanism is actuated and the chip is secured in place by the pressure plate, the assembly can be returned to a horizontal orientation. The plunger mechanism can alternatively be actuated after the assembly is horizontal but this may introduce more error in the initial position of the chip.

In this embodiment the plunger mechanism also includes a temperature regulation system which allows testing of the chip under different temperature conditions. Accordingly, no rubber layer is interposed between pressure plate 58 and chip 34 to ensure direct thermal transfer between the pressure plate and the chip. The temperature regulation system may include elements 62 embedded in plunger block 56. The elements may be used to heat the chip, cool it, or both, in a controlled fashion. For example, elements 62 may be heating elements that rely on Joule heating supplied by an electrical power source, or cooling elements that carry a coolant fluid such as liquid nitrogen supplied by a pump. The plunger mechanism may further have automated pressure control using, e.g., a pneumatic system.

FIG. 4 also illustrates positioning blocks or bosses 64 which can be attached to or formed on the upper surface of test carrier 38 to keep frame block 31 in a generally central location by means of corresponding channels cut into the bottom surface of frame block 31. Different frame blocks 31 can be provided for different chip sizes, i.e., having different socket sizes. A single chip attach frame can support multiple test carriers 38 by having multiple sockets, in which case multiple plunger mechanisms (including the rubber strips) can also be provided for each chip location.

The components of a chip attach frame according to various embodiments of the present invention may be constructed of any durable material. Frame block 31, plunger block 56, and pressure plate 58 are preferably constructed of a metal with an appropriate heat transfer coefficient. Rubber strips 60 are preferably a polymer, i.e., an elastomer whose glass-liquid transition is below the operational temperature of the test system; different rubber strips could be used depending on the planned testing temperatures. The rubber strips can also be used to fix the pressure plate in the horizontal direction and thereby avoid displacement of the chip as the plunger is actuated. To this end, the top and/or bottom surfaces of the rubber strips could be covered or treated with special materials to increase the coefficient of friction. The rubber strips can for example be adhered to the top of the chip attach frame. The rubber material is most preferably sufficiently hard to avoid cracking of the chip substrate, e.g., silicon, when the required force of the plunger is applied. The total required force for a reliable contact is a function of the number of contact points between the chip and the carrier. The dimensions of the chip attach frame may vary considerably depending upon the particular application. In an exemplary embodiment adapted for a 25 mm×25 mm central processing unit chip, frame block 31 is approximately 35 mm×35 mm×5 mm.

The present invention can accordingly provide a quick and easy method for alignment and attachment of a chip to a carrier, resulting in a much shorter turn around time for testing/diagnostics. Because the method can be implemented without solder connections between the pins and pads, it also avoids "No Defect Found" situations that can arise from self-healing effects during a hot solder process step. The invention further accommodates individual saw cut tolerances in the chips without significant expense.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention is particularly useful in temporary chip attachment, it is not constrained to temporary attachment and could be used for permanent attachment wherein solder balls are provided on the carrier and the chip/carrier assembly is passed through a furnace to melt with solder balls while still aligned by the chip attach frame. Similarly, the invention is not limited to testing purposes but can also be employed for functional usage of a chip/carrier package. It is therefore contemplated that such modifications can be made without departing from the spirit or scope of the present invention as defined in the appended claims.

What is claimed is:

1. A method of connecting pins on a lower surface of an integrated circuit chip with pads on an upper surface of a chip carrier, comprising:

placing a frame block above the upper surface of the chip carrier, the frame block having a socket opening defining two alignment edges forming a reference corner, the socket opening being larger than the integrated circuit chip and located such that the pads are accessible through the socket opening when the frame block is so placed above the upper surface of the chip carrier, and the frame block being movable in at least first and second non-parallel directions along the upper surface of the chip carrier;

lowering the integrated circuit chip into the socket opening until the lower surface of the integrated circuit chip rests on the upper surface of the chip carrier;

inclining the chip carrier while it supports the frame block and integrated circuit chip until the integrated circuit chip moves under force of gravity toward the reference corner to abut the alignment edges of the socket opening; and adjusting the position of the frame block by moving it in the first direction and moving it in the second direction, until the pins are aligned with the pads.

2. The method of claim 1 wherein:

the integrated circuit chip is rectangular; and the two alignment edges are orthogonal.

3. The method of claim 2 wherein the first and second directions are parallel with the two alignment edges, respectively.

4. The method of claim 1 wherein:

the frame block is biased against movement in the first direction and is biased against movement in the second direction; and the position of the frame block is adjusted using first screw means which pushes against a first side of the frame block in the first direction and using second screw means which pushes against a second side of the frame block in the second direction.

5. The method of claim 1, further comprising securing the integrated circuit chip in forcible engagement with the chip carrier after the pins are aligned with the pads using a plunger mechanism which pushes a pressure plate against an upper surface of the integrated circuit chip.

6. The method of claim 1, further comprising operatively attaching a test board to a lower surface of the chip carrier.

\* \* \* \* \*